United States Patent
Wang et al.

(10) Patent No.: US 12,029,105 B2
(45) Date of Patent: Jul. 2, 2024

(54) FLEXIBLE SUBSTRATE AND FABRICATION METHOD THEREOF, AND FLEXIBLE DISPLAY APPARATUS

(71) Applicant: BOE TECHNOLOGY GROUP CO., LTD., Beijing (CN)

(72) Inventors: Hejin Wang, Beijing (CN); Mingche Hsieh, Beijing (CN); Weifeng Zhou, Beijing (CN); Shanchen Kao, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/303,463

(22) Filed: Apr. 19, 2023

(65) Prior Publication Data

US 2023/0263045 A1    Aug. 17, 2023

Related U.S. Application Data

(63) Continuation of application No. 17/664,711, filed on May 24, 2022, now Pat. No. 11,665,956, which is a
(Continued)

(30) Foreign Application Priority Data

Sep. 8, 2016    (CN) .......................... 201610810819.3

(51) Int. Cl.
    *H10K 77/10*    (2023.01)
    *H10K 50/844*   (2023.01)
    *H10K 102/00*   (2023.01)

(52) U.S. Cl.
    CPC .......... *H10K 77/111* (2023.02); *H10K 50/844* (2023.02); *H10K 2102/00* (2023.02); *H10K 2102/311* (2023.02)

(58) Field of Classification Search
    CPC ........................... H10K 77/111; H10K 50/844
    See application file for complete search history.

(56) References Cited

U.S. PATENT DOCUMENTS

| 7,656,497 B2 | 2/2010 | Lee et al. |
| 9,099,685 B2 | 8/2015 | Kim et al. |

(Continued)

FOREIGN PATENT DOCUMENTS

| CN | 1918002 A | 2/2007 |
| CN | 101101391 A | 1/2008 |

(Continued)

OTHER PUBLICATIONS

International Preliminary Report on Patentability received for PCT Patent Application No. PCT/CN2017/090261, mailed on Mar. 21, 2019, 12 pages (7 pages of English Translation and 5 pages of Original Document).

(Continued)

*Primary Examiner* — Douglas M Menz
(74) *Attorney, Agent, or Firm* — WOMBLE BOND DICKINSON (US) LLP

(57) ABSTRACT

The embodiments of the disclosure disclose a flexible display apparatus. The flexible display apparatus includes a flexible substrate, a display device and a flexible encapsulation layer. The flexible substrate includes a first organic layer, an inorganic buffer layer, and a second organic layer, the inorganic buffer layer is between the first organic layer and the second organic layer, and the first organic layer includes inorganic nano-particles; the display device is located between the flexible substrate and the flexible encapsulation layer; the flexible encapsulation layer is configured to encapsulate the display device.

19 Claims, 5 Drawing Sheets

Related U.S. Application Data continuation of application No. 16/915,652, filed on Jun. 29, 2020, now Pat. No. 11,374,184, which is a continuation-in-part of application No. 15/764,312, filed as application No. PCT/CN2017/090261 on Jun. 27, 2017, now Pat. No. 10,749,125.

(56) References Cited

U.S. PATENT DOCUMENTS

| | | | |
|---|---|---|---|
| 10,749,125 | B2 | 8/2020 | Wang et al. |
| 2005/0175831 | A1 | 8/2005 | Kim et al. |
| 2007/0026168 | A1 | 2/2007 | Kishimoto et al. |
| 2008/0008905 | A1 | 1/2008 | Yamazaki |
| 2008/0124467 | A1 | 5/2008 | Chapel et al. |
| 2009/0288773 | A1 | 11/2009 | Bolden, II et al. |
| 2011/0039097 | A1 | 2/2011 | Murashige et al. |
| 2011/0169590 | A1 | 7/2011 | Namerikawa et al. |
| 2011/0287233 | A1 | 11/2011 | Ma et al. |
| 2012/0193232 | A1 | 8/2012 | Yu et al. |
| 2014/0087162 | A1 | 3/2014 | Ma et al. |
| 2014/0217383 | A1 | 8/2014 | Park et al. |
| 2014/0316074 | A1 | 10/2014 | Park et al. |
| 2014/0339527 | A1 | 11/2014 | Lee et al. |
| 2014/0346473 | A1 | 11/2014 | Park et al. |
| 2014/0353613 | A1 | 12/2014 | Cheon |
| 2014/0356636 | A1 | 12/2014 | Sun et al. |
| 2015/0086778 | A1 | 3/2015 | Ryu et al. |
| 2015/0123098 | A1 | 5/2015 | Kang |
| 2015/0303389 | A1 | 10/2015 | Kim et al. |
| 2015/0314576 | A1 | 11/2015 | Sun et al. |
| 2016/0204365 | A1 | 7/2016 | Choi et al. |
| 2016/0351631 | A1 | 12/2016 | Lee |
| 2017/0020007 | A1 | 1/2017 | Park et al. |
| 2017/0040406 | A1 | 2/2017 | Park et al. |
| 2017/0062760 | A1 | 3/2017 | Kim |
| 2017/0077198 | A1 | 3/2017 | Song et al. |
| 2017/0162825 | A1 | 6/2017 | Xiao et al. |
| 2018/0287080 | A1 | 10/2018 | Wang et al. |

FOREIGN PATENT DOCUMENTS

| | | |
|---|---|---|
| CN | 101407590 A | 4/2009 |
| CN | 101410334 A | 4/2009 |
| CN | 101587827 A | 11/2009 |
| CN | 101631416 A | 1/2010 |
| CN | 101831175 A | 9/2010 |
| CN | 102015287 A | 4/2011 |
| CN | 102080145 A | 6/2011 |
| CN | 102108485 A | 6/2011 |
| CN | 102145260 A | 8/2011 |
| CN | 102216074 A | 10/2011 |
| CN | 102223760 A | 10/2011 |
| CN | 202107635 U | 1/2012 |
| CN | 102577104 A | 7/2012 |
| CN | 103531724 A | 1/2014 |
| CN | 103547449 A | 1/2014 |
| CN | 103930489 A | 7/2014 |
| CN | 103985823 A | 8/2014 |
| CN | 104167424 A | 11/2014 |
| CN | 104183783 A | 12/2014 |
| CN | 104347640 A | 2/2015 |
| CN | 104349897 A | 2/2015 |
| CN | 104576970 A | 4/2015 |
| CN | 104752371 A | 7/2015 |
| CN | 104823298 A | 8/2015 |
| CN | 105070847 A | 11/2015 |
| CN | 105336870 A | 2/2016 |
| CN | 105552247 A | 5/2016 |
| CN | 105789440 | 7/2016 |
| CN | 105845844 A | 8/2016 |
| CN | 106206945 A | 12/2016 |
| TW | 201502166 A | 1/2015 |
| WO | 2015/084073 A1 | 6/2015 |

OTHER PUBLICATIONS

International Search Report received for PCT Patent Application No. PCT/CN2017/090261, mailed on Sep. 30, 2017, 7 pages (3 pages of English Translation and 4 pages of Original Document).

Non-Final Office Action received for U.S. Appl. No. 15/764,312, mailed on Jan. 9, 2020, 22 pages.

Non-Final Office Action received for U.S. Appl. No. 16/915,652, mailed on Nov. 9, 2021, 16 pages.

Notice of Allowance received for U.S. Appl. No. 15/764,312, mailed on Apr. 16, 2020, 14 pages.

Notice of Allowance received for U.S. Appl. No. 16/915,652, mailed on Feb. 25, 2022, 8 pages.

Notice of Allowance received for U.S. Appl. No. 17/664,711, mailed on Jan. 23, 2023, 22 pages.

Notice of Incomplete Reply received for U.S. Appl. No. 16/915,652, mailed on Jul. 16, 2020, 2 pages.

Notice to File Corrected Application Papers received for U.S. Appl. No. 16/915,652, mailed on Jul. 10, 2020, 2 pages.

Office Action received for Chinese Patent Application No. 201610810819.3, mailed on Aug. 14, 2019, 15 pages (8 pages of English Translation and 7 pages of Office Action).

Office Action received for Chinese Patent Application No. 201610810819.3, mailed on Feb. 24, 2018, 18 pages (10 pages of English Translation and 8 pages of Office Action).

Office Action received for Chinese Patent Application No. 201610810819.3, mailed on Jul. 16, 2020, 37 pages (27 pages of English Translation and 10 pages of Office Action).

Office Action received for Chinese Patent Application No. 201610810819.3, mailed on Mar. 20, 2019, 20 pages (14 pages of English Translation and 6 pages of Office Action).

Office Action received for Chinese Patent Application No. 201610810819.3, mailed on Mar. 25, 2020, 18 pages (11 pages of English Translation and 7 pages of Office Action).

Office Action received for Chinese Patent Application No. 201610810819.3, mailed on Nov. 21, 2019, 18 pages (10 pages of English Translation and 8 pages of Office Action).

Office Action received for Chinese Patent Application No. 201610810819.3, mailed on Sep. 29, 2018, 14 pages (7 pages of English Translation and 7 pages of Office Action).

Written Opinion received for PCT Patent Application No. PCT/CN2017/090261, mailed on Sep. 30, 2017, 9 pages (5 pages of English Translation and 4 pages of Original Document).

FLEXIBLE SUBSTRATE AND FABRICATION METHOD THEREOF, AND FLEXIBLE DISPLAY APPARATUS

RELATED APPLICATIONS

The present application is a Continuation Application of the U.S. patent application Ser. No. 17/664,711, filed on May 24, 2022 and entitled "FLEXIBLE SUBSTRATE AND FABRICATION METHOD THEREOF, AND FLEXIBLE DISPLAY APPARATUS". Application Ser. No. 17/664,711 is a Continuation Application of the U.S. patent application Ser. No. 16/915,652, filed on Jun. 29, 2020 and entitled "FLEXIBLE SUBSTRATE AND FABRICATION METHOD THEREOF, AND FLEXIBLE DISPLAY APPARATUS", which is a Continuation-in-Part of U.S. patent application Ser. No. 15/764,312, filed on Mar. 28, 2018, issued as U.S. Pat. No. 10,749,125 on Aug. 18, 2020, which is a national phase application of PCT/CN2017/090261 filed on Jun. 27, 2017, which claims the benefit of Chinese Patent Application No. 201610810819.3, filed on Sep. 8, 2016, the entire disclosures of which are incorporated herein by reference.

TECHNICAL FIELD

The present disclosure relates to the field of display technology, in particular to a flexible substrate, a fabrication method thereof, and a flexible display apparatus.

BACKGROUND

A display apparatus is an apparatus for displaying a picture, such as a character, a number, a symbol, a photo, or an image formed by a combination of at least two of a character, a number, a symbol and a photo. At present, display apparatuses can be divided into rigid display apparatuses and flexible display apparatuses. The flexible display apparatuses have the advantages of good impact resistance, strong shock resistance, light weight, small size, and convenient portability, and have drawn wide attention.

A flexible display apparatus generally includes a flexible substrate, a display device formed on the flexible substrate, and a flexible encapsulation layer for encapsulating the display device. When fabricating a flexible display apparatus, a flexible substrate is generally formed on a rigid auxiliary substrate (such as a glass substrate), then a display device is formed on the flexible substrate and the display device is encapsulated by a flexible encapsulation layer. Then the flexible substrate is separated from the rigid auxiliary substrate, thus a flexible display apparatus is obtained.

SUMMARY

The embodiments of the disclosure provide the following technical solutions.

According to a first aspect of the present disclosure, a flexible substrate is provided. The flexible substrate includes a first organic layer, an inorganic buffer layer, and a second organic layer. The inorganic buffer layer is between the first organic layer and the second organic layer; the second organic layer includes inorganic nano-particles.

Optionally, a thickness of the first organic layer is approximately twice a thickness of the second organic layer.

Optionally, the thickness of the first organic layer is approximately 9.8 µm, and the thickness of the second organic layer is approximately 5.22 µm.

Optionally, the thickness of the first organic layer is approximately 9.7 µm, and the thickness of the second organic layer is approximately 4.7 µm.

Optionally, the thickness of the first organic layer is approximately 9.6 µm, and the thickness of the second organic layer is approximately 5.2 µm.

Optionally, the thickness of the first organic layer is approximately 9.6 µm, and the thickness of the second organic layer is approximately 4.7 µm.

Optionally, the thickness of the first organic layer is approximately 9.4 µm, and the thickness of the second organic layer is approximately 5.3 µm.

Optionally, the thickness of the first organic layer is approximately 9.4 µm, and the thickness of the second organic layer is approximately 4.8 µm.

Optionally, the thickness of the first organic layer is approximately 9.39 µm, and the thickness of the second organic layer is approximately 5.42 µm.

Optionally, the thickness of the first organic layer is approximately 9.16 µm, and the thickness of the second organic layer is approximately 5.26 µm.

Optionally, a thickness of the first organic layer is approximately equal to a thickness of the second organic layer.

Optionally, a thickness of the first organic layer is approximately 11.3 µm, and a thickness of the second organic layer is approximately 10.5 µm.

Optionally, a thickness of the first organic layer is approximately 8.9 µm, and a thickness of the second organic layer is approximately 9.5 µm.

Optionally, a thickness of the first organic layer is approximately 5.3 µm, and a thickness of the second organic layer is approximately 5.3 µm.

Optionally, a thickness of the inorganic buffer layer is in a range of 500-700 nm.

Optionally, the material of the first organic layer and/or the second organic layer is polyimide, polyethylene naphthalate, polyethylene terephthalate, polyarylate, polycarbonate, polyetherimide, or polyethersulfone.

Optionally, the materials of the first organic layer and the second organic layer are both polyimide.

Optionally, the second organic layer is doped with inorganic nano-particles.

Optionally, the material of the inorganic nano-particles is at least one of silicon oxide, aluminum oxide or titanium oxide.

Optionally, the material of the inorganic buffer layer is at least one of silicon oxide, silicon nitride or silicon oxynitride.

Optionally, the flexible substrate further includes a rigid auxiliary substrate disposed on a surface of the first organic layer facing away from the inorganic buffer layer.

According to a second aspect of the present disclosure, a flexible display apparatus is provided. The flexible display apparatus includes the flexible substrate according to the technical solution described above, a display device and a flexible encapsulation layer. The display device is located on a side of the flexible substrate facing away from the first organic layer. The flexible encapsulation layer is used to encapsulate the display device. The flexible substrate and the display device are covered by the flexible encapsulation layer, and the display device is encapsulated between the flexible substrate and the flexible encapsulation layer by the flexible encapsulation layer.

According to a third aspect of the present disclosure, a method for fabricating a flexible substrate is provided. The method is used to fabricate the flexible substrate according to the technical solution described above. The fabrication method includes: forming a first organic layer on a rigid auxiliary substrate; and forming an inorganic buffer layer on the first organic layer. The first organic layer and the inorganic buffer layer form an organic-inorganic composite structure.

Optionally, after the step of forming the inorganic buffer layer on the first organic layer, the fabrication method further includes: forming a second organic layer on the inorganic buffer layer. The second organic layer is doped with inorganic nano-particles.

Optionally, the step of forming the second organic layer on the inorganic buffer layer includes: providing a coating solution of an organic material which forms the second organic layer; adding inorganic nano-particles to the coating solution, and mixing them uniformly; and coating the coating solution mixed with the inorganic nano-particles on the inorganic buffer layer, and curing the coating solution mixed with the inorganic nano-particles to form the second organic layer. Alternatively, the step of forming the second organic layer on the inorganic buffer layer includes: providing a coating solution of an organic material which forms the second organic layer; adding a precursor of inorganic nano-particles to the coating solution, and mixing them uniformly; coating the coating solution mixed with the precursor of inorganic nano-particles on the inorganic buffer layer, and curing the coating solution mixed with the precursor of inorganic nano-particles, converting the precursor of inorganic nano-particles into inorganic nano-particles to form the second organic layer.

BRIEF DESCRIPTION OF THE DRAWINGS

The drawings illustrated herein are used to provide a further comprehension of the present disclosure and constitute a part of the present disclosure. The exemplary embodiments and the illustration of the present disclosure are used to explain the present disclosure, and are not intended to limit the present disclosure. In the drawings.

DETAILED DESCRIPTION OF THE DISCLOSURE

In the related art, an expansion coefficient of a flexible substrate is usually much higher than that of a rigid auxiliary substrate, and the temperature of the environment in which the rigid auxiliary substrate and the flexible substrate are placed usually changes during the fabrication of the flexible display apparatus. Therefore, when the temperature of the environment in which the rigid auxiliary substrate and the flexible substrate are placed changes, the deformation rate of the flexible substrate is larger than that of the rigid auxiliary substrate, which easily leads to warping of the rigid auxiliary substrate, thereby resulting in a low process accuracy when fabricating the display device.

Therefore, it is desired to provide a flexible substrate, a fabrication method thereof, and a flexible display apparatus for solving the technical problem of low process accuracy when fabricating a display device due to warping of a rigid auxiliary substrate.

In order to further illustrate the flexible substrate, the fabrication method thereof, and the flexible display apparatus provided by the embodiments of the present disclosure, details are described below with reference to the drawings in the specification.

Figure 1:
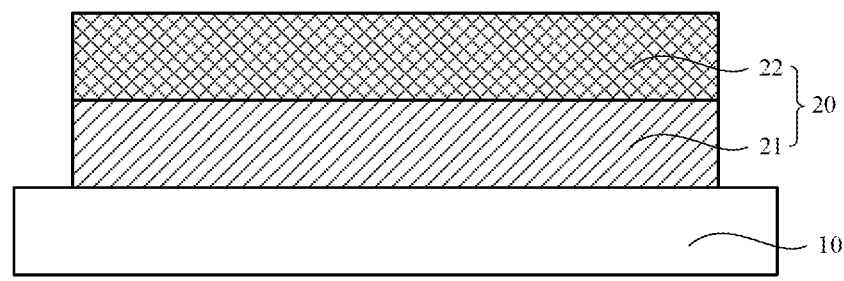
FIG. 1 is a structural schematic diagram of a flexible substrate provided by an embodiment of the present disclosure.

With reference to FIG. 1, a flexible substrate 20 provided by an embodiment of the present disclosure includes a first organic layer 21 and an inorganic buffer layer 22 stacked together. The first organic layer 21 and the inorganic buffer layer 22 form an organic-inorganic composite structure. Specifically, when fabricating the flexible substrate 20, the first organic layer 21 is formed on the rigid auxiliary substrate 10 first. Then the surface of the first organic layer 21 facing away from the rigid auxiliary substrate 10 can be cleaned and activated, e.g., by a plasma treatment. Then the inorganic buffer layer 22 is formed and stacked on the first organic layer 21, and the inorganic buffer layer 22 is in close contact with the first organic layer 21. The first organic layer 21 and the inorganic buffer layer 22 form an organic-inorganic composite structure.

The flexible substrate 20 provided by the embodiment of the present disclosure includes the first organic layer 21 and the inorganic buffer layer 22 stacked together. The first organic layer 21 and the inorganic buffer layer 22 form an organic-inorganic composite structure. There is an interface between the first organic layer 21 and the inorganic buffer layer 22. Since the expansion coefficient of the inorganic material is smaller than that of the organic material, the expansion coefficient of the inorganic buffer layer 22 is smaller than that of the first organic layer 21. Due to the effect of the interface, compared with the flexible substrate formed with only the organic material, the expansion coefficient of the flexible substrate 20 provided by the embodiment of the present disclosure is closer to the expansion coefficient of the rigid auxiliary substrate 10. Therefore, the expansion coefficient of the flexible substrate 20 provided by the embodiment of the present disclosure is reduced and more matched with that of the rigid auxiliary substrate 10, so as to reduce the risk of warping of the rigid auxiliary substrate 10 and then improve the process accuracy and reduce the process error when fabricating the display device. Moreover, with the above configuration, it is advantageous to fabricate a flexible display apparatus of high resolution.

Figure 3:
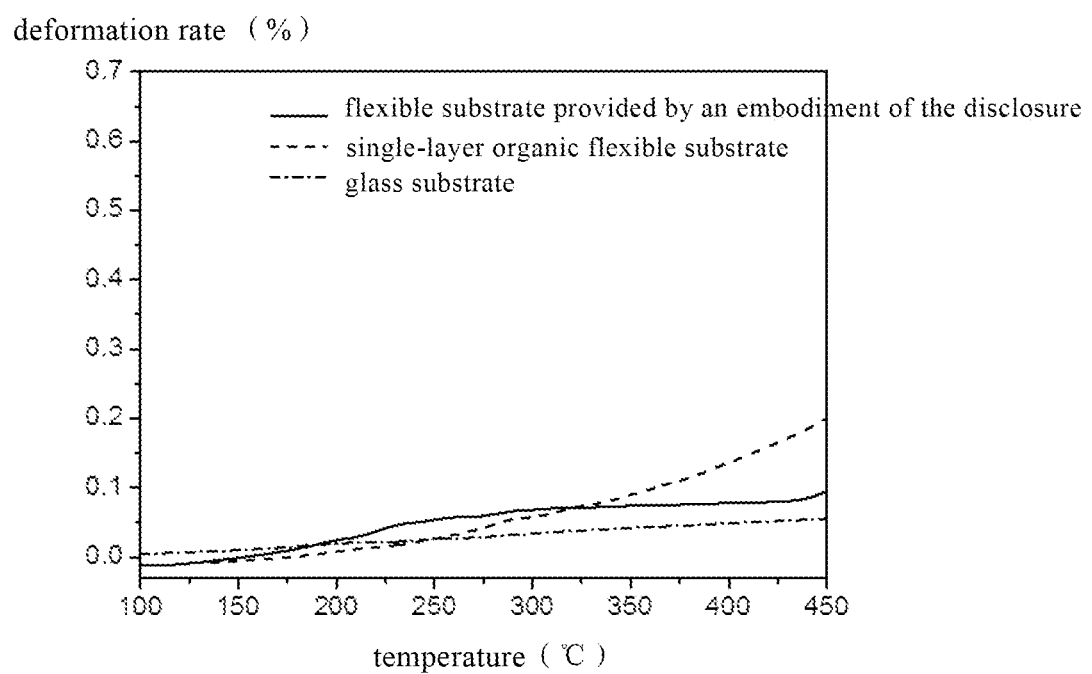
FIG. 3 is a comparison chart of the deformation rates of a flexible substrate provided by an embodiment of the present disclosure, a single-layer organic flexible substrate and a glass substrate at different temperatures.

As shown in FIG. 3, a thermal mechanical analysis (TMA) is performed on the flexible substrate 20 provided by the embodiment of the present disclosure, a single-layer organic flexible substrate and a glass substrate respectively. It can be seen that when the glass substrate is used as the rigid auxiliary substrate 10, compared with the single-layer organic flexible substrate, the deformation rates of the flexible substrate 20 provided by the embodiment of the present disclosure are more matched with the deformation rates of the rigid auxiliary substrate 10 (e.g. a glass substrate) at different temperatures. In particular, at a high temperature of 350° C. or higher, compared with the single-layer organic flexible substrate, the deformation rates of the flexible substrate 20 provided by the embodiment of the present disclosure are more matched with the deformation rates of the rigid auxiliary substrate 10 (i.e. a glass substrate) at different temperatures. Therefore, the flexible substrate 20 provided by the embodiment of the present disclosure can be more suitable for the high temperature requirement when fabricating the flexible display apparatus. For example, for a flexible display apparatus using the low temperature poly-silicon (LTPS) technology, a high temperature of 400° C. or a higher temperature is usually required during the fabrication. Since the deformation rate of the flexible substrate 20 provided by the embodiment of the present disclosure at a temperature of 350° C. or higher is more matched with that of the rigid auxiliary substrate 10 (e.g. a glass substrate), for the flexible display apparatus using the flexible substrate 20 provided by the embodiment of the present disclosure, warping of the rigid auxiliary substrate 10 can be prevented during the fabrication of the flexible display apparatus, so as to improve the process accuracy and reduce the process error when fabricating the display device.

Figure 2A:
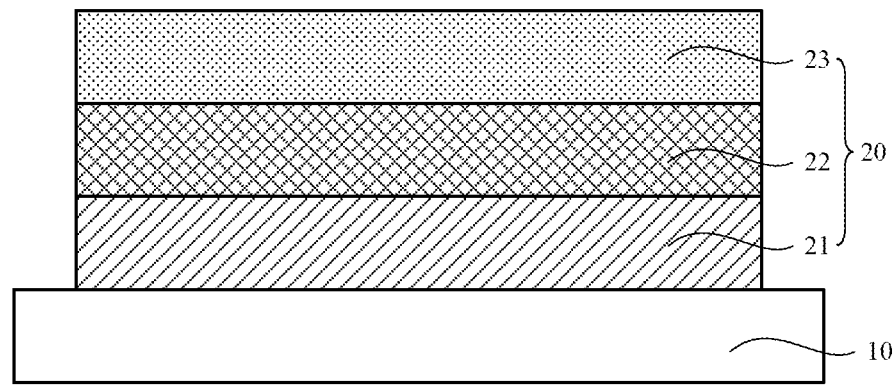
FIG. 2a is a structural schematic diagram of another flexible substrate provided by an embodiment of the present disclosure.

With continued reference to FIG. 2a, the flexible substrate 20 provided by the embodiment of the present disclosure further includes a second organic layer 23. The inorganic buffer layer 22 is located between the first organic layer 21 and the second organic layer 23. The second organic layer 23 can protect the inorganic buffer layer 22 so that the stress on the surface of the inorganic buffer layer 22 facing the first organic layer 21 matches the stress on the surface of the inorganic buffer layer 22 facing the second organic layer 23, thereby preventing the inorganic buffer layer 22 from cracking due to the uneven stress. In addition, in such an arrangement, the second organic layer 23, the inorganic buffer layer 22 and the first organic layer 21 together form an organic-inorganic-organic stacked structure. Due to the effect of the interface between the first organic layer 21 and the inorganic buffer layer 22 and the interface between the inorganic buffer layer 22 and the second organic layer 23, the expansion coefficient of the flexible substrate 20 is further reduced, so as to further reduce the risk of warping of the rigid auxiliary substrate 10, and then improve the process accuracy when fabricating the display device.

In practical applications, the first organic layer 21 can include one organic material layer, and can also include a plurality of organic material layers. The second organic layer 23 can include one organic material layer, and can also include a plurality of organic material layers. If the second organic layer 23 includes a plurality of organic material layers, inorganic material layers can also be interposed between the plurality of organic material layers. The inorganic buffer layer 22 can include one inorganic material layer, and can also include a plurality of inorganic material layers.

In the embodiment of the present disclosure, the second organic layer 23 is doped with inorganic nano-particles. That is to say, the second organic layer 23 includes inorganic nano-particles. Doping inorganic nano-particles in the second organic layer 23 can increase the bonding effect between the second organic layer 23 and the inorganic buffer layer 22, and prevent the interlayer separation between the second organic layer 23 and the inorganic buffer layer 22. In addition, doping inorganic nano-particles in the second organic layer 23 can reduce the expansion coefficient of the second organic layer 23, so as to further reduce the expansion coefficient of the flexible substrate 20 and further reduce the risk of warping of the rigid auxiliary substrate 10, and then improve the process accuracy when fabricating the display device.

It is noted that the first organic layer 21 can also be doped with inorganic nano-particles to increase the bonding effect between the first organic layer 21 and the inorganic buffer layer 22, and prevent the interlayer separation between the first organic layer 21 and the inorganic buffer layer 22, while reducing the expansion coefficient of the first organic layer 21.

In the above embodiments, the material of the first organic layer 21 can be selected from various kinds of organic materials such as polyimide, polyethylene naphthalate, polyethylene terephthalate, polyarylate, polycarbonate, polyetherimide and polyethersulfone. Optionally, the material of the first organic layer 21 is polyimide.

The material of the second organic layer 23 can be selected from various kinds of organic materials such as polyimide, polyethylene naphthalate, polyethylene terephthalate, polyarylate, polycarbonate, polyetherimide and polyethersulfone. Optionally, the material of the second organic layer 23 is polyimide.

The material of the inorganic nano-particles can be selected from various kinds of inorganic materials such as silicon oxide, aluminum oxide and titanium oxide.

The material of the inorganic buffer layer 22 can be selected from various kinds of inorganic materials. For example, the inorganic buffer layer 22 can be silicon oxide, silicon nitride, silicon oxynitride, aluminum oxide, etc. Alternatively, the material of the inorganic buffer layer 22 can be several of silicon oxide, silicon nitride, silicon oxynitride, and aluminum oxide. Optionally, the material of the inorganic buffer layer 22 can be at least one of silicon oxide, silicon nitride or silicon oxynitride. For example, the material of the inorganic buffer layer 22 is one of silicon oxide, silicon nitride and silicon oxynitride. Alternatively, the material of the inorganic buffer layer 22 can be silicon oxide and silicon nitride. For example, the inorganic buffer layer 22 includes a silicon oxide layer and a silicon nitride layer. Alternatively, the material of the inorganic buffer layer 22 can be silicon oxide and silicon oxynitride. For example, the inorganic buffer layer 22 includes a silicon oxide layer and a silicon oxynitride layer. Alternatively, the material of the inorganic buffer layer 22 can be silicon nitride and silicon oxynitride. For example, the inorganic buffer layer 22 includes a silicon nitride layer and a silicon oxynitride layer. Alternatively, the material of the inorganic buffer layer 22 can be silicon oxide, silicon nitride and silicon oxynitride. For example, the inorganic buffer layer 22 includes a silicon oxide layer, a silicon nitride layer and a silicon oxynitride layer.

In the above embodiments, the thickness of the first organic layer 21, the inorganic buffer layer 22, and the second organic layer 23 can be set according to actual requirements and actual fabrication capabilities. For example, the thickness of the first organic layer 21 and the thickness of the second organic layer 23 can be greater than or equal to 2 µm, the thickness of the inorganic buffer layer 22 can range from 100 nm to 600 nm, and the thickness of the inorganic buffer layer 22 can be e.g. 100 nm, 300 nm or 600 nm.

Figure 2B:
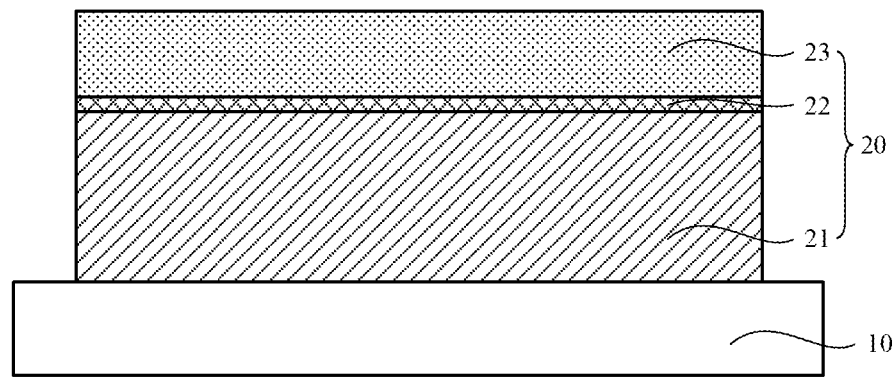
FIG. 2b is a structural schematic diagram of another flexible substrate provided by an embodiment of the present disclosure.

In some embodiments of the present disclosure, as shown in FIG. 2b, the thickness of the first organic layer 21 is approximately twice the thickness of the second organic layer 23. For example, the thickness of the first organic layer 21 may be approximately 9.8 µm, the thickness of the inorganic buffer layer 22 may be approximately 658 nm, and the thickness of the second organic layer 23 may be approximately 5.22 µm. Alternatively, the thickness of the first organic layer 21 may be approximately 9.7 µm, the thickness of the inorganic buffer layer 22 may be approximately 679 nm, and the thickness of the second organic layer 23 may be approximately 4.7 µm. Alternatively, the thickness of the first organic layer 21 may be approximately 9.6 µm, the thickness of the inorganic buffer layer 22 may be approximately 661 nm, and the thickness of the second organic layer 23 may be approximately 5.2 µm. Alternatively, the thickness of the first organic layer 21 may be approximately 9.6 µm, the thickness of the inorganic buffer layer 22 may be approximately 679 nm, and the thickness of the second organic layer 23 may be approximately 4.7 µm. Alternatively, the thickness of the first organic layer 21 may be approximately 9.4 µm, the thickness of the inorganic buffer layer 22 may be approximately 611 nm, and the thickness of the second organic layer 23 may be approximately 5.3 µm. Alternatively, the thickness of the first organic layer 21 may be approximately 9.4 µm, the thickness of the inorganic buffer layer 22 may be approximately 565 nm, and the thickness of the second organic layer 23 may be approximately 4.8 µm. Alternatively, the thickness of the first organic layer 21 may be approximately 9.39 µm, the thickness of the inorganic buffer layer 22 may be approximately 661 nm, and the thickness of the second organic layer 23 may be approximately 5.42 µm. Alternatively, the thickness of the first organic layer 21 may be approximately 9.16 µm, the thickness of the inorganic buffer layer 22 may be approximately 614 nm, and the thickness of the second organic layer 23 may be approximately 5.26 µm.

In some embodiments of the present disclosure, the thickness of the first organic layer 21 is approximately equal to the thickness of the second organic layer 23. For example, the thickness of the first organic layer 21 may be approximately 11.3 µm, the thickness of the inorganic buffer layer 22 may be approximately 615 nm, and the thickness of the second organic layer 23 may be approximately 10.5 µm. Alternatively, the thickness of the first organic layer 21 may be approximately 8.9 µm, the thickness of the inorganic buffer layer 22 may be approximately 700 nm, and the thickness of the second organic layer 23 may be approximately 9.5 µm. Alternatively, the thickness of the first organic layer 21 may be approximately 5.3 µm, the thickness of the inorganic buffer layer 22 may be approximately 608 nm, and the thickness of the second organic layer 23 may be approximately 5.3 µm.

In an embodiment of the present disclosure, the thickness of the inorganic buffer layer is in a range of 500-700 nm.

In the context of the present disclosure, the word "approximately" means that it may be strictly equal to or approximately equal to the value mentioned. For example, a value of ±10% error can be regarded as approximately equal to the mentioned value.

Optionally, the flexible substrate further includes a rigid auxiliary substrate 10 disposed on a surface of the first organic layer 21 facing away from the inorganic buffer layer 22. In various treatment processes, the rigid auxiliary substrate can support the first organic layer, the inorganic buffer layer (and the second organic layer), so that various treatment processes can be performed on the flexible substrate. In the final stage of the fabrication, the first organic layer can be separated from the rigid auxiliary substrate.

Figure 4:
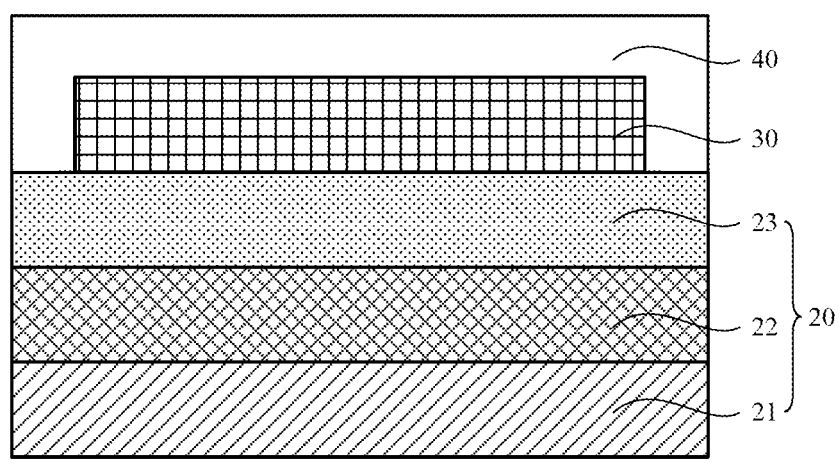
FIG. 4 is a structural schematic diagram of a flexible display apparatus provided by an embodiment of the present disclosure.

With reference to FIG. 4, an embodiment of the present disclosure further provides a flexible display apparatus, which includes the flexible substrate 20 according to the above embodiments, a display device 30, and a flexible encapsulation layer 40. The display device 30 is located on a side of the flexible substrate 20 facing away from the first organic layer 21. The flexible substrate 20 and the display device 30 are covered by the flexible encapsulation layer 40, and the display device 30 is encapsulated between the flexible substrate 20 and the flexible encapsulation layer 40 by the flexible encapsulation layer 40.

The advantages of the flexible display apparatus with respect to the prior art are the same as that of the flexible substrate described above, and details are not described herein again.

Figure 5:
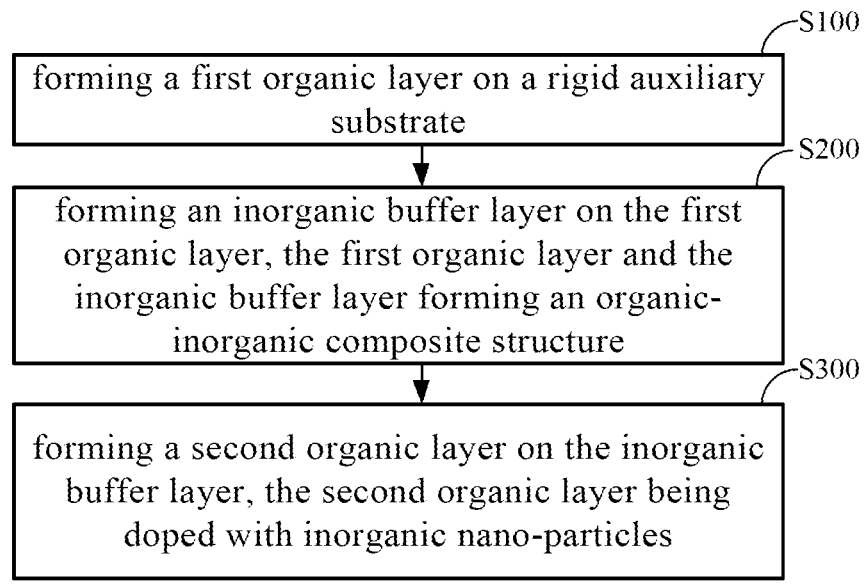
FIG. 5 is a flow chart of a method for fabricating a flexible substrate provided by an embodiment of the present disclosure.

With reference to FIG. 5, an embodiment of the present disclosure further provides a method for fabricating a flexible substrate for fabricating the flexible substrate described in the above embodiments. The fabrication method includes the following steps: step S100, forming a first organic layer on a rigid auxiliary substrate; and step S200, forming an inorganic buffer layer on the first organic layer, the first organic layer and the inorganic buffer layer forming an organic-inorganic composite structure.

In a specific implementation, in the step S100, a coating solution of an organic material which forms the first organic layer such as a polyimide coating solution, can be provided first. Then the coating solution of the organic material which forms the first organic layer is disposed on a rigid auxiliary substrate such as a glass substrate by coating, spraying, printing, etc. After the coating solution of the organic material which forms the first organic layer is dried and cured, the first organic layer can be formed. After the formation of the first organic layer is completed, the surface of the first organic layer facing away from the rigid auxiliary substrate can be cleaned and activated by plasma treatment, to facilitate the close contact between the inorganic buffer layer and the first organic layer. In the step S200, after the formation of the first organic layer is completed, the inorganic buffer layer can be formed on the first organic layer by using e.g. plasma enhanced chemical vapor deposition (PECVD). The inorganic buffer layer is in close contact with the first organic layer, and the first organic layer and the inorganic buffer layer form an organic-inorganic composite structure.

Each embodiment in this specification is described in a progressive manner, and the same or similar parts in various embodiments can refer to each other, and each embodiment focuses on differences from other embodiments. Particularly, for the method embodiment, the description is relatively simple because it is basically similar to the product embodiment, and for the relevant part, reference can be made to the description of the product embodiment.

In an embodiment of the present disclosure, the flexible substrate can further include a second organic layer stacked on the surface of the inorganic buffer layer facing away from the first organic layer. With continued reference to FIG. 5, in the step S200, after the inorganic buffer layer is formed on the first organic layer, the method for fabricating the flexible substrate provided by the embodiment of the present disclosure further includes a step S300: forming a second organic layer on the inorganic buffer layer, the second organic layer being doped with inorganic nano-particles.

In the above embodiments, the following two exemplary modes can be adopted for the step of forming the second organic layer on the inorganic buffer layer.

Figure 6:
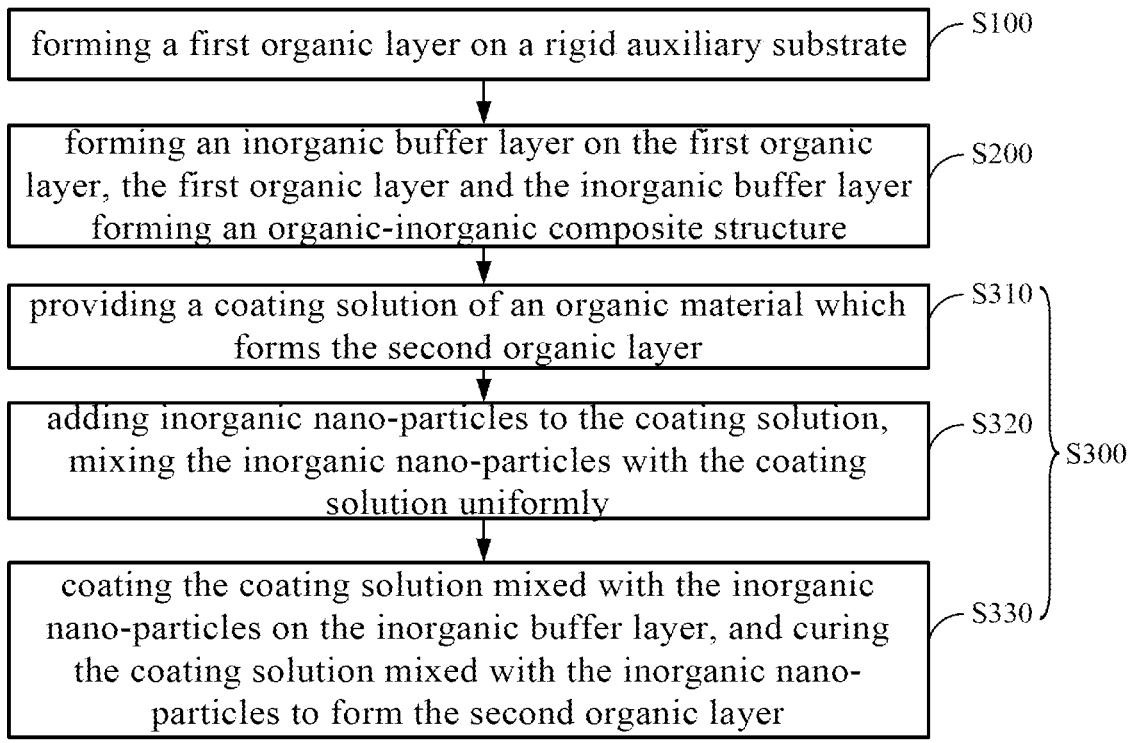
FIG. 6 is a flow chart of a method for fabricating a flexible substrate provided by another embodiment of the present disclosure.

Mode 1: with reference to FIG. 6, in the step S300, the step of forming the second organic layer on the inorganic buffer layer includes: step S310, providing a coating solution of the organic material which forms the second organic layer; step S320, adding inorganic nano-particles to the coating solution, and mixing them uniformly; and step S330, coating the coating solution mixed with the inorganic nano-particles on the inorganic buffer layer, and curing the coating solution mixed with the inorganic nano-particles to form the second organic layer.

For example, the organic material forming the second organic layer can be polyimide and the material of inorganic nano-particles can be silicon dioxide. When forming the second organic layer on the inorganic buffer layer, the polyimide coating solution can be provided first, then the silicon dioxide nano-particles are added to the polyimide coating solution and uniformly mixed; and then the polyimide coating solution mixed with the silicon dioxide nano-particles is coated on the inorganic buffer layer by coating, spraying, printing, etc. After the polyimide coating solution mixed with the silicon dioxide nano-particles is dried and cured, the second organic layer is formed.

The step of forming the second organic layer on the inorganic buffer layer can also adopt the following mode.

Figure 7:
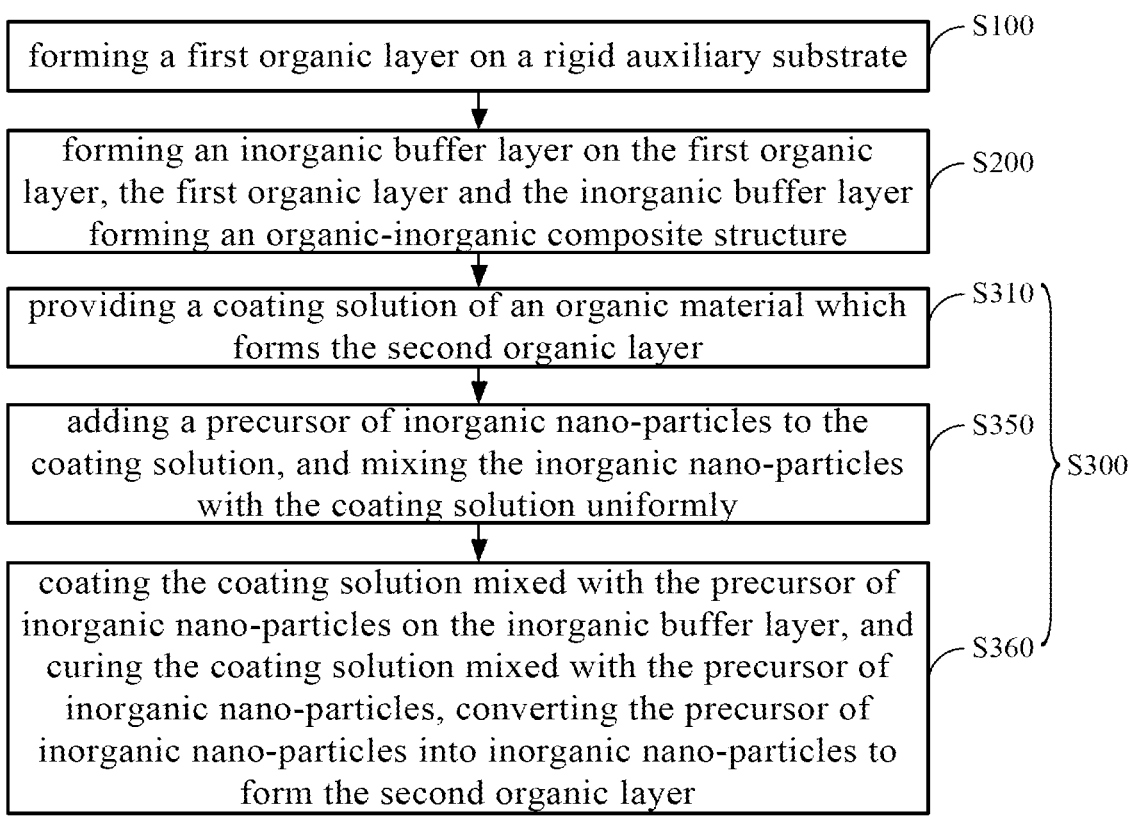
FIG. 7 is a flowchart of a method for fabricating a flexible substrate provided by yet another embodiment of the present disclosure.

Mode 2: with reference to FIG. 7, in the step S300, the step of forming the second organic layer on the inorganic buffer layer includes: step S310, providing a coating solution of the organic material which forms the second organic layer; step S350, adding a precursor of inorganic nano-particles to the coating solution, and mixing them uniformly; and step S360, coating the coating solution mixed with the precursor of inorganic nano-particles on the inorganic buffer layer, and curing the coating solution mixed with the precursor of inorganic nano-particles, converting the precursor of inorganic nano-particles into inorganic nano-particles to form the second organic layer.

For example, the organic material forming the second organic layer can be polyimide and the material of inorganic nano-particles can be silicon dioxide. In this case, the precursor of inorganic nano-particles can be tetraethylorthosilicate ($Si(OC_2H_5)_4$). When forming the second organic layer on the inorganic buffer layer, the polyimide coating solution can be provided first, then tetraethylorthosilicate is added to the polyimide coating solution and uniformly mixed; and then the polyimide coating solution in which tetraethylorthosilicate is mixed is coated on the inorganic buffer layer by coating, spraying, or printing, etc. In the process of drying and curing the polyimide coating solution in which tetraethoxysilane is mixed, tetraethoxysilane undergoes in situ reaction in polyimide to form silicon dioxide nano-particles. With the silicon dioxide nano-particles doped in polyimide, the second organic layer is formed.

Figure 8:
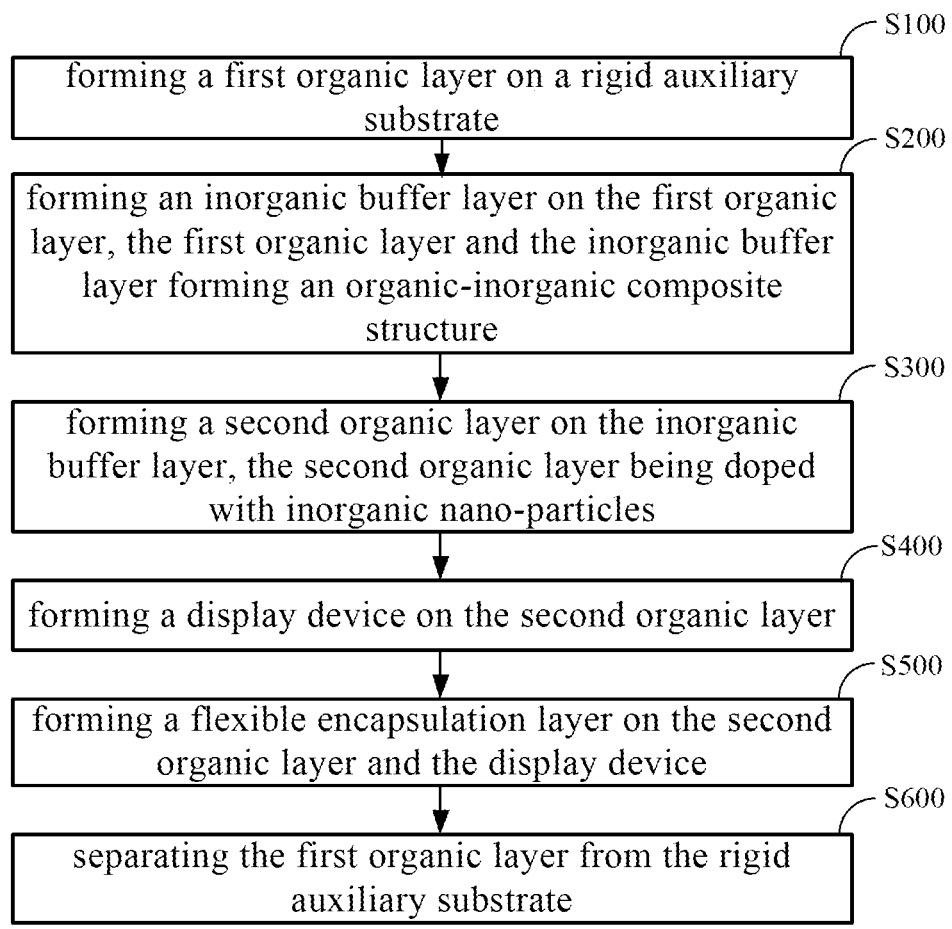
FIG. 8 is a flowchart of a method for fabricating a flexible display apparatus provided by an embodiment of the present disclosure.

With reference to FIG. 8, an embodiment of the present disclosure further provides a method for fabricating a flexible display apparatus, which includes the method for fabricating the flexible substrate described in the above embodiments. Specifically, the method for fabricating the flexible display apparatus includes: step S100, forming a first organic layer on the rigid auxiliary substrate; step S200, forming an inorganic buffer layer on the first organic layer, the first organic layer and the inorganic buffer layer forming an organic-inorganic composite structure; optional step S300, forming a second organic layer on the inorganic buffer layer, the second organic layer being doped with inorganic nano-particles; step S400, forming a display device on the second organic layer; step S500, forming a flexible encapsulation layer on the second organic layer and the display device; and step S600, separating the first organic layer from the rigid auxiliary substrate.

In the above embodiments, the display device includes a driving device and an OLED light emitting device. The driving device can be a thin film transistor, and the OLED light emitting device can include an anode, a cathode, and an organic light emitting layer between the anode and the cathode.

In the above description of the embodiments, a particular feature, structure, material, or characteristic can be combined in any suitable manner in any one or more of the embodiments or examples.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

The invention claimed is:

1. A flexible display apparatus comprising:
   a first organic layer;
   an inorganic layer on the first organic layer;
   a second organic layer on a side of the inorganic layer away from the first organic layer;
   a display device on a side of the second organic layer away from the first organic layer and comprising a driving device and an organic light emitting diode device; and
   an encapsulation layer on a side of the display device away from the first organic layer,
   wherein the driving device comprises a thin film transistor, and the organic light emitting diode device comprises an anode, a cathode and an organic light emitting layer between the anode and the cathode,
   wherein a thickness of the first organic layer is greater than or equal to 2 µm, and a thickness of the inorganic layer is 100 nm to 600 nm, and
   wherein the second organic layer comprises inorganic nano-particles.

2. The flexible display apparatus according to claim 1, wherein a thickness of the second organic layer is greater than or equal to 2 µm.

3. The flexible display apparatus according to claim 1, wherein the thickness of the inorganic layer is 300 nm to 600 nm.

4. The flexible display apparatus according to claim 1, wherein a material of the inorganic layer is at least one selected from a group consisting of silicon oxide, silicon nitride, silicon oxynitride and aluminum oxide.

5. The flexible display apparatus according to claim 4, wherein the material of the inorganic layer comprises silicon oxide and silicon nitride, and the inorganic layer comprises a silicon oxide layer and a silicon nitride layer.

6. The flexible display apparatus according to claim 4, wherein the material of the inorganic layer comprises silicon oxide and silicon oxynitride, and the inorganic layer comprises a silicon oxide layer and a silicon oxynitride layer.

7. The flexible display apparatus according to claim 4, wherein the material of the inorganic layer comprises silicon nitride and silicon oxynitride, and the inorganic layer comprises a silicon nitride layer and a silicon oxynitride layer.

8. The flexible display apparatus according to claim 4, wherein the material of the inorganic layer comprises silicon oxide, silicon nitride and silicon oxynitride, and the inorganic layer comprises a silicon oxide layer, a silicon nitride layer and a silicon oxynitride layer.

9. The flexible display apparatus according to claim 1, wherein
the first organic layer comprises a single organic material layer, or
the first organic layer comprises a plurality of organic material layers.

10. The flexible display apparatus according to claim 1, wherein
the second organic layer comprises a single organic material layer, or
the second organic layer comprises a plurality of organic material layers.

11. The flexible display apparatus according to claim 10, wherein the second organic layer comprises the plurality of organic material layers and an inorganic material layer, and the inorganic material layer is arranged among the plurality of organic material layers.

12. The flexible display apparatus according to claim 1, wherein a material of the first organic layer is selected from a group consisting of polyimide, polyethylene naphthalate, polyethylene terephthalate, polyarylate, polycarbonate, polyetherimide, and polyethersulfone.

13. The flexible display apparatus according to claim 1, wherein a material of the second organic layer is selected from a group consisting of polyimide, polyethylene naphthalate, polyethylene terephthalate, polyarylate, polycarbonate, polyetherimide, and polyethersulfone.

14. The flexible display apparatus according to claim 1, wherein the materials of the first organic layer and the second organic layer are both polyimide.

15. The flexible display apparatus according to claim 1, wherein a material of the inorganic nano-particles is selected from a group consisting of silicon dioxide, aluminum oxide, and titanium oxide.

16. The flexible display apparatus according to claim 1, wherein the first organic layer comprises inorganic nano-particles.

17. The flexible display apparatus according to claim 16, wherein a material of the inorganic nano-particles is selected from a group consisting of silicon dioxide, aluminum oxide, and titanium oxide.

18. The flexible display apparatus according to claim 1, further comprising a rigid auxiliary substrate disposed on a surface of the first organic layer away from the inorganic layer.

19. The flexible display apparatus according to claim 1, wherein the thickness of the first organic layer is approximately equal to a thickness of the second organic layer.

* * * * *